United States Patent [19]

Spurr

[11] 4,450,411

[45] May 22, 1984

[54] AUTOMATIC CALIBRATION SYSTEM FOR SIGNAL AMPLIFIER CIRCUITS

[75] Inventor: Robert N. Spurr, Englewood, Colo.

[73] Assignee: Honeywell Inc., Minneapolis, Minn.

[21] Appl. No.: 402,393

[22] Filed: Jul. 27, 1982

[51] Int. Cl.³ ............................................. G01R 19/00
[52] U.S. Cl. ........................................... 330/2; 324/74
[58] Field of Search .................. 330/2, 132, 279, 52, 330/137; 324/74; 360/65

[56] References Cited

U.S. PATENT DOCUMENTS 3,725,784  4/1973  Bayer ............................ 324/74 X Primary Examiner—James B. Mullins
Assistant Examiner—Steven J. Mottola
Attorney, Agent, or Firm—Mitchell J. Halista; Charles Ungemach

[57] ABSTRACT

An automatic calibration system for signal amplifier circuits uses a single complex power signal to replace the formerly used four separate sinewave frequencies and a square wave signal. In the illustrated embodiment of the invention, the power signal is recorded on a magnetic tape and is played back through reproduce equalizer circuits which apply the reproduced signal to a tracking frequency converter to produce an amplitude measurement of each of the preselected frequency components forming the complex power signal. The amplitude measurements are referenced to the power signal's actual harmonic content to enable an adjustment of the equalizer circuits to produce a minimum error in the playback signal. A bandpass phase response measurement is also performed on the reproduced signal by comparing the phase difference between the reproduced signal and a synthesized power signal after the amplitude compensation produced by the amplitude measurements.

19 Claims, 9 Drawing Figures

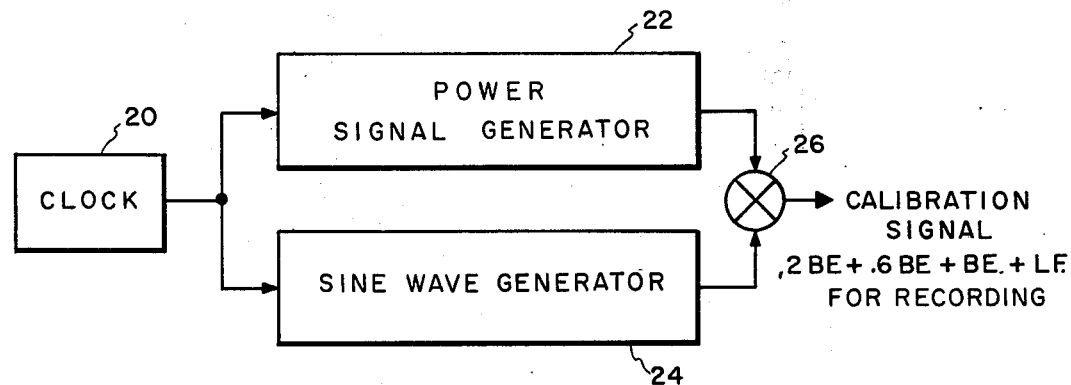
F I G. 4
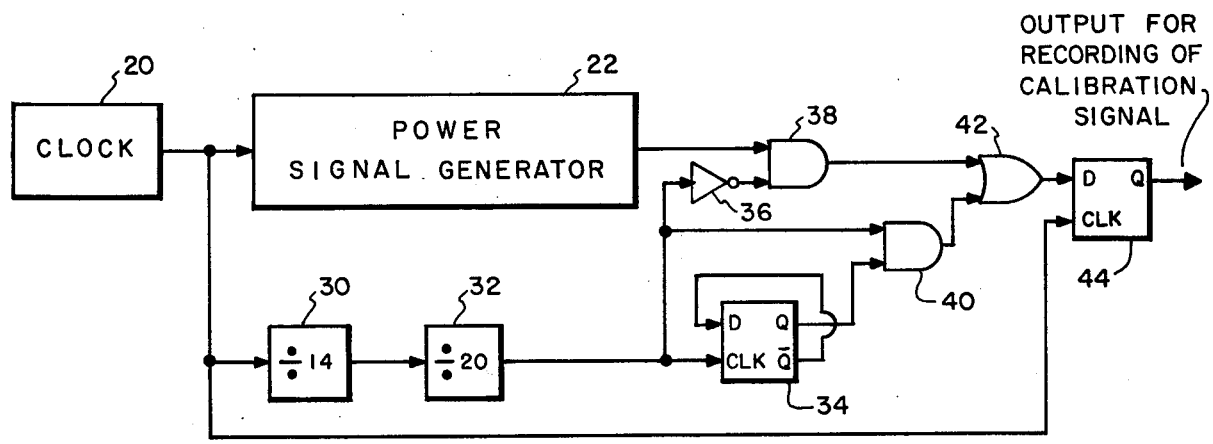
F I G. 5
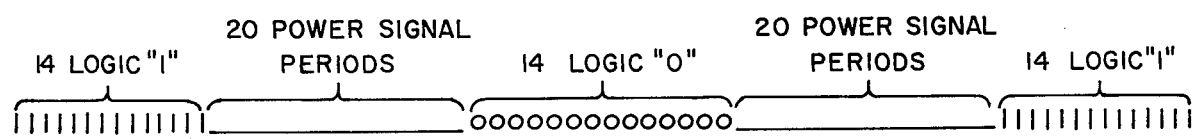
F I G. 6

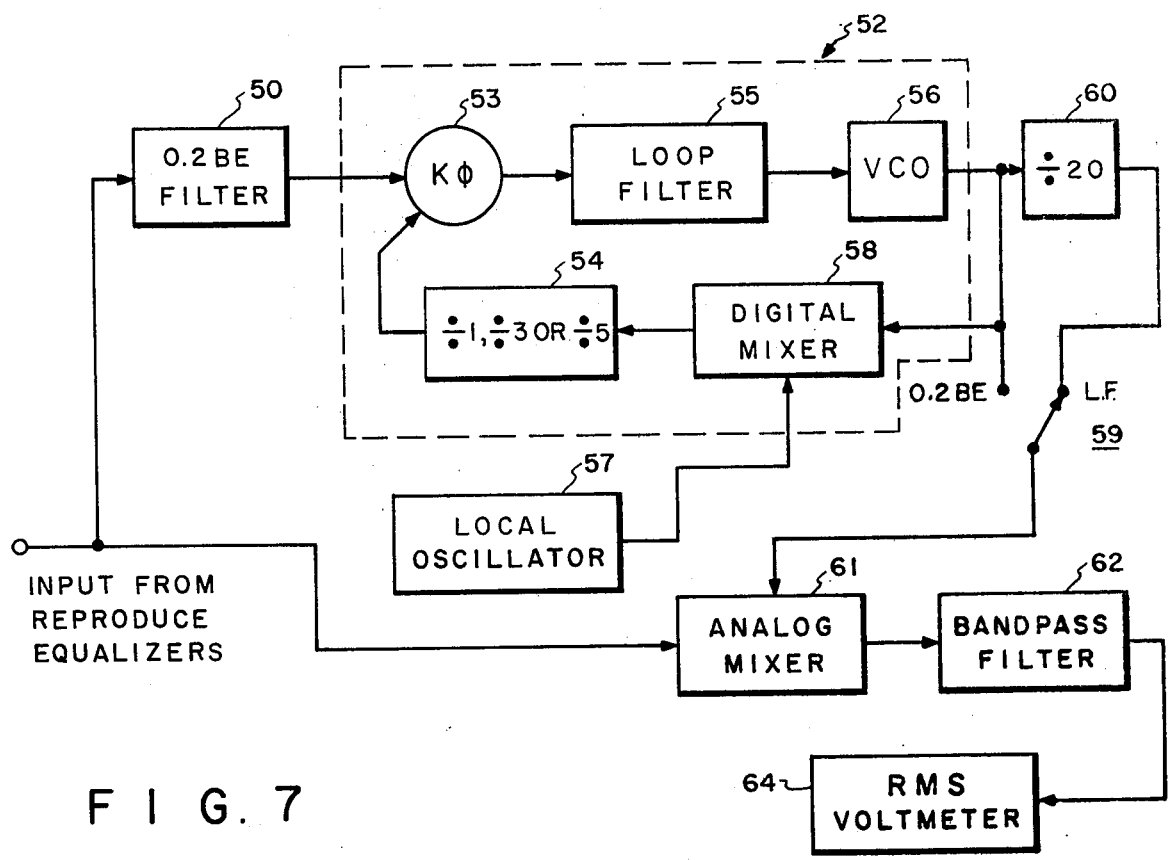
F I G. 7
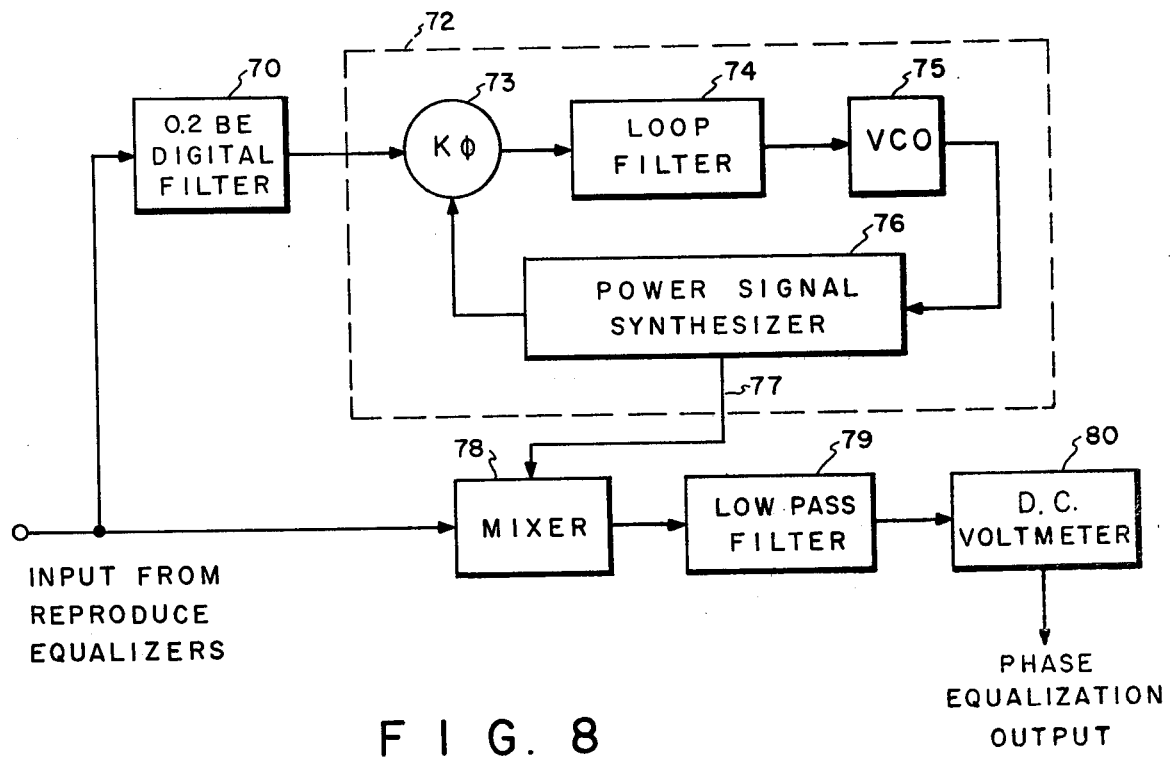
F I G. 8

4,450,411

AUTOMATIC CALIBRATION SYSTEM FOR SIGNAL AMPLIFIER CIRCUITS

BACKGROUND OF THE INVENTION

Field of the Invention

The present invention is related to magnetic tape playback systems. More specifically, the present invention is directed to an automatic calibration system for equalizer amplifiers used in magnetic tape playback systems.

SUMMARY OF THE INVENTION

An object of the present invention is to provide an improved automatic calibration system for signal amplifier circuits.

In accomplishing this and other objects, there has been provided, in accordance wih the present invention an automatic calibration system for signal amplifier circuits utilizing a signal generator for producing a complex calibration signal containing a desired harmonic content and a low frequency component signal. In one embodiment, the calibration signal is recorded and is reproduced for application to reproduce amplifiers or equalizers. The output of the equalizers is applied to amplitude and phase monitoring circuits to provide a calibration of the equalizers whereby the equalized calibration signal corresponds to the recorded signal.

DESCRIPTION OF THE DRAWINGS

A better understanding of the present invention may be had when the following detailed description is read in connection with the accompanying drawings, in which:

FIG. 4 is a block diagram of a circuit for adding a sinewave to the power signal generated by the circuit shown in FIG. 2, FIG. 5 is a digital implementation of the circuit shown in FIG. 4, FIG. 6 is a waveform diagram of the composite power signal, FIG. 7 is a calibration circuit embodying an example of the present invention, FIG. 8 is a relative phase measuring circuit using the power signal shown in FIG. 6.

DESCRIPTION OF THE PREFERRED EMBODIMENT

Detailed Description

Figure 1:
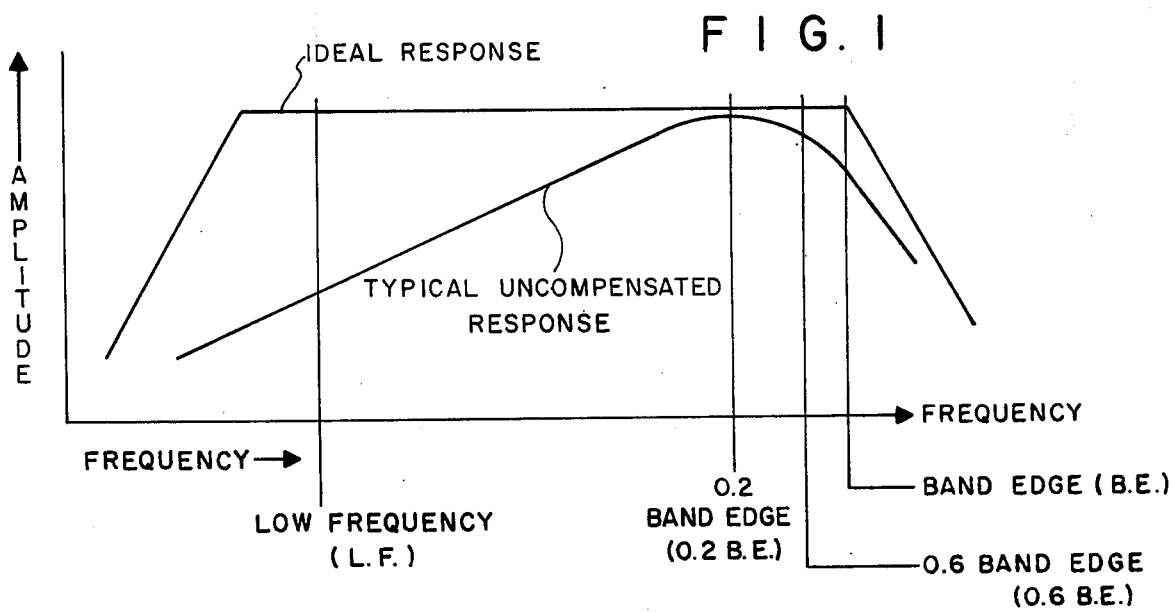
FIG. 1 is a waveshape diagram illustrating the operation of the playback amplifier circuits showing an ideal and an actual frequency response curve.

Referring to FIG. 1 in more detail, there is shown a frequency vs. amplitude diagram of an ideal response of an amplifier circuit and an uncompensated response curve of a reproduce or playback circuit as used in a magnetic tape recorder. The playback or reproduce equalizer amplifier must compensate for the recording and playback process by an equal and opposite amplitude response so that the composite tape playback system data output substantially resembles the original data input prior to recording. The four illustrated calibration frequencies, i.e., BE, 0.6 BE, 0.2 BE and LF, were formerly produced by a signal generation apparatus which generated four separate sine frequencies and a square wave signal. A wide band Root Mean Square (RMS) voltmeter was connected to the reproduce equalizer output to enable an operator to adjust a reproduce equalizer for the proper amplitude response. The four sinewave signals were used for amplitude calibration, and the square wave was used for phase calibration of the reproduce equalizer circuitry. The automatic calibration circuitry taught by the present invention has the capability for generating and analyzing a single complex signal which replaces all of the individual signals used previously. This is a significant improvement because the calibration system can measure any frequency component or phase response at any time at any tape speed. In addition, this complex signal, which is referred to herein as a "power signal" can be used for a recorded preamble for later calibration to compensate for playback headware, differences in magnetic tape oxides, etc., to insure consistent playback data quality.

The four calibration frequency components shown in FIG. 1 are 0.6 BE, BE, 0.2 BE and LF. Since the 0.6 BE and BE signals are third and fifth harmonics, respectively, of the 0.2 BE signal, a waveform with a period corresponding to 0.2 BE containing only the harmonics can be used to generate three of the four calibration frequencies. The digital circuitry shown in FIG. 2 synthesizes the "power signal" waveform shown in FIG. 3. Thus, an initial clock signal from a clock signal generator 2 having a frequency of 2.8 BE is supplied to the clock input terminal of a digital counter 4 having four flip-flop stages. The $Q_a$ output from the first flip-flop stage A of the register 4 is supplied as the "power signal" and is fed back to the input of the second stage B of the counter 4. A plurality of exclusive OR gates 6, 8 and 10 and a four input NAND gates 12 combine the signals from the counter 4 to produce the waveshape shown in FIG. 3. Specifically, the $Q_B$ and $Q_C$ outputs of the second stage B and the third stage C are applied to the OR gate 6. The $Q_B$ output is also applied as one input to the NAND gate 12 and as a feedback signal to the input of the third stage C of the counter 4. The $\overline{Q}_A$ output is applied as a second input to the NAND gate 12 while the $\overline{Q}_C$ and $Q_D$ outputs are applied as third and fourth inputs to the NAND gate 12, respectively. The $Q_C$ output is also applied as a feedback to the input of the fourth D stage of the counter 4 while the output of the first OR gate 6 is applied as a first input to the second OR gate 8 which receives a second input from the $\overline{Q}_D$ output of the register 4. The output of the second OR gate 8 and the output of the NAND gate 12 are applied as inputs to the third OR gate 12. The output of the third OR gate 12 is applied as a feedback input to the input of the first A stage of the counter 4.

Figure 2:
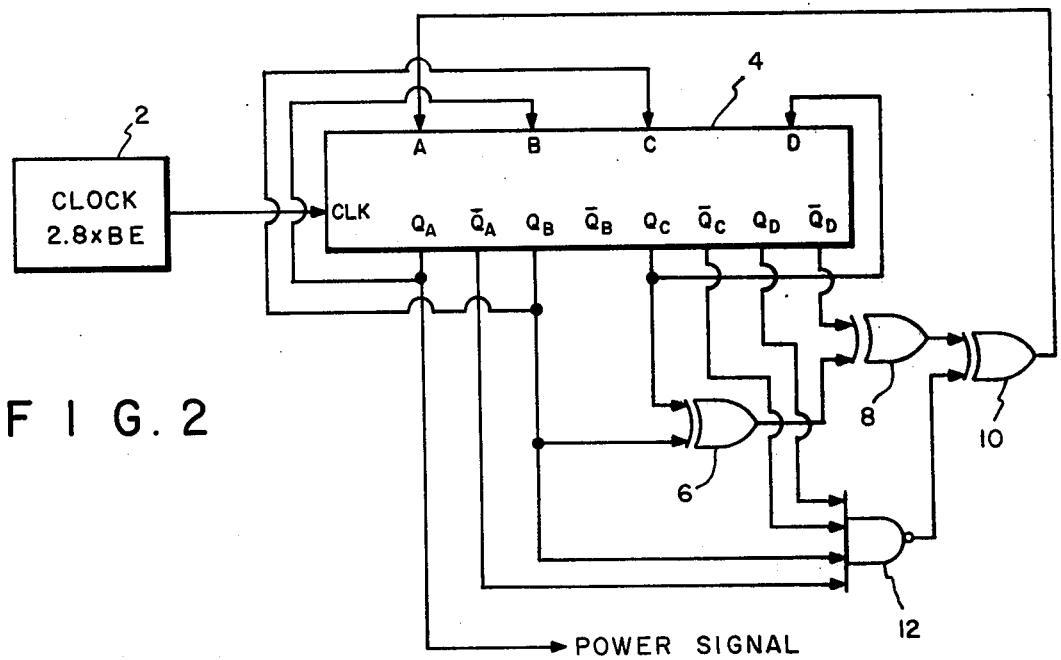
FIG. 2 is a circuit for synthesizing a power signal waveform.
Figure 3:
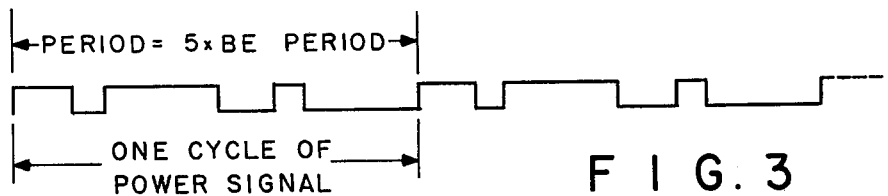
FIG. 3 is an illustration of a power signal waveform obtained with the circuit shown in FIG. 2.

The circuit shown in FIG. 2 is effective to synthesize the power waveform shown in FIG. 3 from the output of the clock signal source 2. This waveform contains six harmonics which are within the passband of the playback equalizer. Since the power signal has half wave symmetry, all even harmonic amplitudes are zero. The power signal generated by the circuit in FIG. 2 provides the three highest calibration frequencies concurrently. The operational difference between calibration with sinewaves as three separate frequencies and using the composite power signal shown in FIG. 3 which contains the three frequencies as harmonics is only a small difference in harmonic amplitude. The fourth calibration signal, the low frequency LF signal, can be generated by adding an alternating DC offset to the signal shown in FIG. 3. FIG. 4 shows a block diagram of a first circuit which would algebraically add a sinewave to the power signal generated by the circuit in FIG. 2. Thus, the circuit in FIG. 4 uses a clock signal from a clock source 20 to operate a power signal generator 22 such as that shown in FIG. 2 and a sinewave generator 24. The outputs of the power signal generator 22 and the sinewave generator 24 are algebraically summed in a summing circuit 26 to provide the composite calibration signal. While this method has the advantage of a single spectral component at the low frequency test point, the alternate circuit shown in FIG. 5 provides a digital method which is easier to implement.

In FIG. 5, the clock signal 20 is used to operate the power signal generator 22 and to provide an input signal for a first frequency divider 30 shown as a divide by fourteen ($\div 14$). The output of the clock 20 is also applied to the clock input terminal of an output flip-flop 44. The output of the first divide circuit 30 is applied to a second frequency divide circuit 32 shown as a divide by twenty ($\div 20$) circuit. The output of the second frequency divide circuit 32 is applied to the clock input of a second flip-flop 34 and through a logical invertor 36 to a first input of a first AND gate 38. Concurrently, the output of the second frequency divider 32 is applied as a first input to a second AND gate 40. A second input for the first AND gate 38 is obtained from the output of the power signal generator 22 while the second input for the second AND gate 40 is obtained from the Q output of the first flip-flop 34 while the $\bar{Q}$ output of the first flip-flop 34 is applied to the D input thereof. The output of the first AND gate 40 is applied to the input of a third AND gate 42 concurrently with the output from the first AND gate 38. The output of the third AND gate 42 is applied to the "D" input of the second flip-flop 44. FIG. 6 illustrates the total power signal pattern obtained with the circuit shown in FIG. 5. This pattern has twenty power signal periods with alternating groups or strings of fourteen logic "ones" followed by fourteen logic "zeros" separated by the twenty power signal periods.

Once the total power signal is recorded on the magnetic tape, the measurement system used to adjust the equalizers in the playback circuit must selectively measure the frequency components of the three harmonics and the low frequency component. This is accomplished with a tracking frequency converter shown in FIG. 7. The unadjusted input from the playback equalizers is connected to the input of the circuit shown in FIG. 7. The 0.2 BE digital filter 50 references the phase locked loop (PLL) 52 through a phase detector 53 and loop filter 55 to a voltage controlled oscillator 56. A frequency divider 54 in the feedback path of the phase lock loop 52 divides the frequency of the 0.2 BE signal by either one, three or five depending on the harmonic to be measured. A digital mixer 58 eliminates or cancels clock periods from the voltage controlled oscillator 56 at a rate set by the local oscillator 57 to offset the phase lock loop output by the 1 KHz center frequency of the bandpass filter 55. The output of the voltage controlled oscillator 56 is applied to one input of a single pole, double throw selector switch 59 as a 0.2 BE input. The output of the voltage control oscillator 56 is also applied to a frequency divider 60 shown as a divide by twenty ($\div 20$) circuit. The output of the frequency divider 56 is applied as a second input to the selector switch 59 to provide a low frequency signal. The output of the switch 59 is applied to an analog mixer 61 to combine the output of the selector switch 59 with the input from the reproduce equalizers. The output of the analog mixer 61 is applied through a bandpass filter 62 to an RMS voltmeter 64.

When the selector switch is set to transmit the 0.2 BE input to the analog mixer 61 and the feedback divider 54 is arranged to divide by "5", the analog mixer 61 receives a signal with a frequency corresponding to the bandedge (BE) component of the input signal plus 1 KHz. The other input to the analog mixer 61 receives the input signal from the reproduce equalizers which contain the total power spectrum. The output from the analog mixer 61 has many intermodulation products of which only the bandedge input frequency component is passed through the bandpass filter 62 to the RMS voltmeter 64. In a similar manner, when the operation of the feedback divider 54 is set between either the divide by "3" or divide by "1" mode, the position of the selector switch 59 provides signals to the analog mixer representing the 0.6 BE signal and the 0.2 BE signal as well as the low frequency component. After amplitude measurements at the four frequencies are obtained, the bandpass response of the direct reproduce equalizers must be determined by referencing the measured harmonic amplitude values to the power signals actual harmonic amplitude. If the equalizer is to be calibrated such that the bandedge frequency response is down 1 dB, the resulting bandedge power signal output should be adjusted to $-3.4$ dB in the measurement system since the power signal bandedge component was recorded at 2.4 dB.

The previous technology method for phase response measurement was based on using a 0.3 bandedge (0.3 BE) square wave recorded on the tape. Using that method, a phase compensation circuit was adjusted so that the "humps", due to time displaced third harmonics, added to the fundamental were equal in amplitude. Some of the shortcomings of this method are that the third harmonic amplitude is down 9.5 dB from the fundamental and therefore has a small effect on the "hump" response which introduces a significant difficulty in making accurate phase adjustments. This method also requires addition of a square wave to the calibration procedure which already uses four sinewave frequencies. Another phase calibration procedure used a pseudo random sequence generator with a bandedge clock frequency. This procedure is not suited for automatic calibration because it relies on the operator to adjust the circuit for the best "eye pattern" observed on an oscilloscope screen. In FIG. 8 there is shown a circuit which uses the power signal to measure the relative phase response of an equalizer. The output from the reproduce equalizers is applied to a 0.2 BE digital filter 70. The output of the filter 70 is applied to a phase lock loop 72. Specifically, the output of the digital filter 70 is applied to the input of a phase detector 73. The output of the phase detector 73 is applied through a loop filter 74 to a voltage controlled oscillator 75. The output of the voltage controlled oscillator 75 is applied to the input of a power signal synthesizer 76. The output of the power signal synthesizer 76 is applied as a feedback signal to a phase detector 73. A phase quadrature signal from the power signal synthesizer 76 is applied from a synthesizer tap 77 to a double balanced mixer 78. A second input to the mixer 78 is obtained from the output from the reproduce equalizers. The output of the mixer 78 is applied through a low pass filter 79 to a DC voltmeter 80 to produce a phase equalization error represenatative signal.

In operation, the 0.2 BE component of the input signal from the reproduce equalizers is selected with the 0.2 BE digital filter 70. The phase lock loop 72 locks the 0.2 BE frequency component of the power signal synthesizer 76 to the filtered equalizer signal's 0.2 BE frequency component. The input signal's amplitude spectrum has previously been adjusted to the levels of the power signal spectrum used in the recording process by the amplitude calibration method discussed above with respect to FIG. 7. Since the power signal synthesizer circuit 76 is identical to the power signal generator circuit shown in FIGS. 2 and 5 used to record on the tape, its output has the same amplitude and phase response and therefore is used as a phase reference. The phase quadrature tap 77 from the power signal synthesizer 76 outputs the synthesized power signal 90°'s out of phase with the incoming power signal into the double balanced mixer 78 to modulate the incoming power signal. The known phase detection characteristics of a double balanced mixer are used to obtain a direct current (DC) offset at the mixer output corresponding to the relative phase difference between the harmonics in the synthesized power signal and the incoming signal from the reproduce equalizers. Since the synthesized power signal is identical in amplitude and phase to the generated signal used in the recording process and the amplitude of the input signals harmonics have been equalized, the DC offset is proportional to the combined phase error in the 3rd and 5th harmonics with respect to the fundamental input signal. Intermodulation products from the phase detection process are removed by the low pass filter 79, and the relative phase error is measured by the digital voltmeter 80. An automatic phase adjustment can be accomplished by adjusting the phase compensation circuit on the reproduce equalizer until the DC voltmeter 80 reads zero volts.

Figure 9:
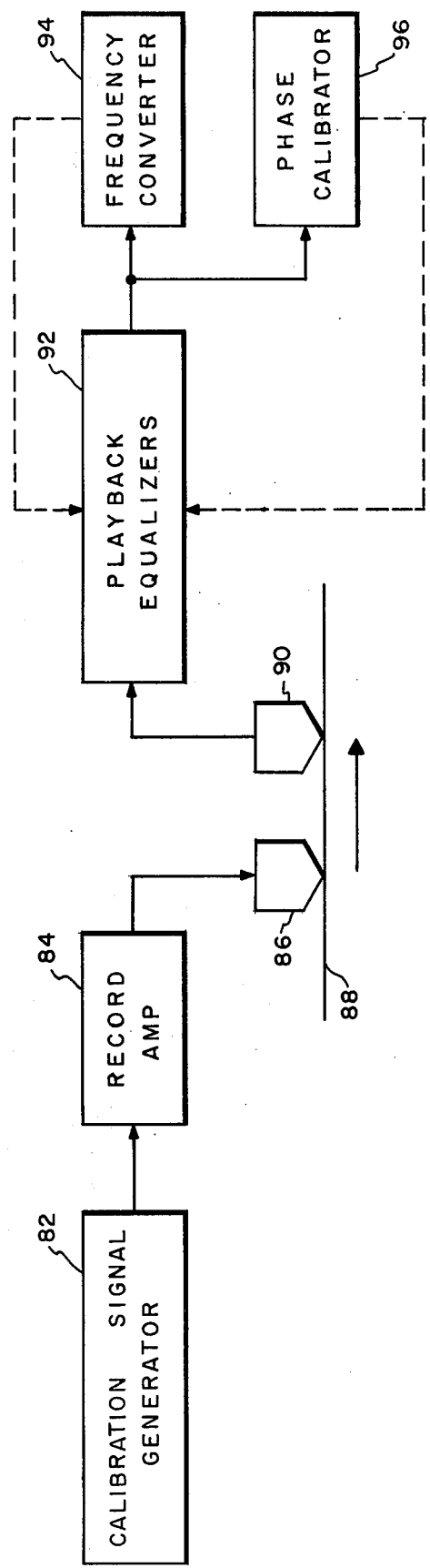
FIG. 9 is a block diagram of a calibration system for a magnetic tape recorder utilizing an example of the present invention.

In FIG. 9, there is shown a block diagram of a tape recording system utilizing an example of the present invention to provide an adjustment or calibration for the playback signal amplifiers or equalizers. Thus, the calibration signal is synthesized by the calibration signal generator 82 and applied through record amplifier circuits 84 to a record head 86 for recording on a magnetic tape 88 being driven in the direction indicated by the arrow. A playback head 90 is arranged to playback the recorded signal which is applied to the reproduce amplifiers or equalizers 92. The output of the equalizer 92 is applied to the frequency converter 94 and to the phase calibrator 96 for effecting an adjustment of the equalizers 92 as described above.

Some of the advantages of the application of the power signal in phase and amplitude calibration of direct reproduce equalizers as performed by the present invention are that a single digital signal can be used for an entire direct reproduce channel amplitude calibration rather than four separate sinewave frequencies. In addition, digital signal generators are easily designed for operation over a wide range of frequencies while sinewave synthesizers are more difficult to design particularly at higher frequencies. The power signal has constant wavelength on the tape for all calibration signals and is, therefore, tape speed independent. Conversely the prior technology alternative used time multiplexing of the four separate sinewave frequencies and one square wave. Time multiplexing produces tape speed incompatability because the signals recorded for calibration at a preselected low tape speed would not cover enough actual tape footage for calibration at higher tape speeds. On the other hand, using the prior technology of time multiplexing and recording calibration at a preselected high tape speed with a reproduction for calibration at a lower tape speed would require either excessive tape movement or shuttling or more calibration time to bypass the unnecessary tape footage of each individual calibration frequency. The same power signal used for amplitude calibration by the present invention is also used for phase calibration. Previously, an additional square wave at 0.1 BE was generated, and the fundamental plus the 3rd harmonic was observed or measured for phase response. Phase response is measured at three points (0.2 BE, 0.6 BE and BE) in the equalized bandpass, and each harmonic is nearly equal in amplitude. Conversely, the prior technology used a square wave at 0.3 BE and measured the phase error of only the 3rd harmonic. Since a square wave's 3rd harmonic is down 9.5 dB from the fundamental, accurate phase measurements were substantially more difficult.

Accordingly, it may be seen that there has been provided, in accordance with the present invention an automatic calibration system for signal amplifier circuits utilizing a single generator for producing a complex signal containing a desired harmonic content and a low frequency calibration signal.

The embodiments of the invention in which an exclusive property or privilege is claimed are defined as follows:

1. A calibration system for signal amplifier circuits comprising
    signal generating means for producing a single complex output signal having a plurality of predetermined frequencies at respective preselected amplitudes,
    recording means for recording said output signal,
    reproducing means for reproducing said recorded output signal,
    signal amplifier means having an adjustable gain characteristic for amplifying said reproduced output signal,
    frequency conversion means for measuring the frequency components of said amplified output signal corresponding to said predetermined frequencies and
    means for providing a correction feedback control for adjusting said gain of said signal amplifier means to produce an amplitude correspondence of said amplified output signal to said output signal from said signal generating means.

2. A calibration system as set forth in claim 1 wherein said single complex output signal includes a plurality of harmonics and a predetermined single frequency signal.

3. A calibration system as set forth in claim 1 wherein said frequency conversion means includes a phase locked loop, means for locking said loop to a predetermined harmonic of said amplified output signal and means for producing an output representative of the amplitude of said predetermined harmonic.

4. A calibration system as set forth in claim 3 wherein said means for producing an output includes an RMS voltmeter for displaying an output corresponding to the difference in amplitude between a harmonic in said amplified output signal and a corresponding harmonic from said phase locked loop.

5. A calibration system as set forth in claim 1 wherein said single complex output signal includes a 0.2 bandedge harmonic, a 0.6 bandedge harmonic, a bandedge harmonic and a low frequency signal below said 0.2 bandedge harmonic.

6. A calibration system as set forth in claim 1 and further includes means for measuring the phase of said amplified output signal to determine a bandpass phase response of said signal amplifier means.

7. A calibration system as set forth in claim 6 wherein said means for measuring the phase includes means for synthesizing a duplicate of said single complex signal, means for comparing said synthesized complex signal with said amplified output signal and means for providing a second correction feedback control for adjusting the phase of said signal amplifier means to produce a phase correspondence of said amplified output signal to said output signal from said signal generating means.

8. A calibration system as set forth in claim 7 wherein said means for producing a second feedback correction control includes a DC voltmeter for displaying an output corresponding to the phase difference between said amplified output signal and said synthesized duplicate of said complex signal.

9. A calibration system as set forth in claim 8 wherein said frequency conversion means includes a phase locked loop, means for locking said loop to a predetermined harmonic of said amplified output signal and means for producing an output representative of the amplitude of said predetermined harmonic.

10. A calibration system as set forth in claim 9 wherein frequency conversion means and said means for measuring the phase each includes a respective filter for removing intermodulation products prior to providing a feedback correction control.

11. A calibration signal for signal amplifier circuits comprising signal generating means for producing a single output signal having a plurality of predetermined frequencies at a preselected amplitude, signal amplifier means having an adjustable gain characteristic for amplifying said output signal, frequency conversion means for measuring the frequency components of said amplified output signal corresponding to said predetermined frequencies, said frequency conversion means including a phase-lock loop, means for locking said loop to a predetermined harmonic of said amplified output signal and means for producing an output representative of the amplitude of said predetermined harmonic, and means for providing a correction feedback control for adjusting said gain of said signal amplifier means to produce an amplitude correspondence of said amplified output signal to said output signal from said signal generating means.

12. A calibration system as set forth in claim 11 wherein said single complex output signal includes a plurality of harmonics and a predetermined single frequency signal.

13. A calibration system as set forth in claim 11 wherein said means for producing an output includes an RMS voltmeter for displaying an output corresponding to the difference in amplitude between a harmonic in said amplified output signal and a corresponding harmonic from said phase locked loop.

14. A calibration system as set forth in claim 11 wherein said single complex output signal includes a 0.2 bandedge harmonic, a 0.6 bandedge harmonic, a bandedge harmonic and a low frequency signal below said 0.2 bandedge harmonic.

15. A calibration system as set forth in claim 11 and further includes means for measuring the phase of said amplified output signal to determine a bandpass phase response of said signal amplifier means.

16. A calibration system as set forth in claim 15 wherein said means for measuring the phase includes means for synthesizing a duplicate of said single complex signal, means for comparing said synthesized complex signal with said amplified output signal and means for providing a second correction feedback control for adjusting the phase of said signal amplifier means to produce a phase correspondence of said amplified output signal to said output signal from said signal generating means.

17. A calibration system as set forth in claim 16 wherein said means for producing a second feedback correction control includes a DC voltmeter for displaying an output corresponding to the phase difference between said amplified output signal and said synthesized duplicate of said complex signal.

18. A calibration system as set forth in claim 17 wherein said frequency conversion means includes a phase locked loop, means for locking said loop to a predetermined harmonic of said amplified output signal and means for producing an output representative of the amplitude of said predetermined harmonic.

19. A calibration system as set forth in claim 18 wherein frequency conversion means and said means for measuring the phase each include a respective filter for removing intermodulation products prior to providing a feedback correction control.

* * * * *